United States Patent [19]

Levand, Jr. et al.

[11] 4,104,705
[45] Aug. 1, 1978

[54] PHOTOFLASH LAMP ARRAY HAVING SHIELDED SWITCHING CIRCUIT

[75] Inventors: Victor A. Levand, Jr., Lyndhurst, Ohio; William A. Lenkner, Neoga, Ill.

[73] Assignee: General Electric Company, Schenectady, N.Y.

[21] Appl. No.: 805,770

[22] Filed: Jun. 13, 1977

[51] Int. Cl.² ............................................. G03B 15/02
[52] U.S. Cl. ........................................ 362/5; 174/68.5; 361/406; 361/412; 362/6; 362/11; 362/13; 431/95 R; 431/95 A; 431/98
[58] Field of Search ............ 240/1.3; 431/95 R, 95 A, 431/98; 361/406, 412; 174/68.5; 362/5, 6, 11, 13

[56] References Cited

U.S. PATENT DOCUMENTS

| 3,894,226 | 7/1975 | Hanson | 240/1.3 |
|---|---|---|---|
| 3,935,442 | 1/1976 | Hanson | 240/1.3 |
| 3,941,992 | 3/1976 | Blount et al. | 240/1.3 |
| 3,980,877 | 9/1976 | Cote | 240/1.3 |
| 4,017,728 | 4/1977 | Audesse et al. | 240/1.3 |
| 4,019,043 | 4/1977 | Blount | 240/1.3 |
| 4,036,578 | 7/1977 | Herman | 240/1.3 |

Primary Examiner—Benjamin R. Padgett
Assistant Examiner—T. S. Gron
Attorney, Agent, or Firm—Norman C. Fulmer; Lawrence R. Kempton; Frank L. Neuhauser

[57] ABSTRACT

A flash lamp array having a plurality of flash lamps positioned over a side of a circuit board having thereon circuitry for sequentially flashing the lamps. A metal shield, in the form of a sheet of metal foil or foil-covered paper, is positioned adjacent to the other side of the circuit board and is in contact with a common electrical run on the circuit board by means of a staple through the circuit board. Strips of radiation-sensitive plastic are positioned between the shield and the circuit board to function as electrical insulation, and also function as flash indicators by distorting due to radiation from an adjacent flashing lamp.

7 Claims, 6 Drawing Figures

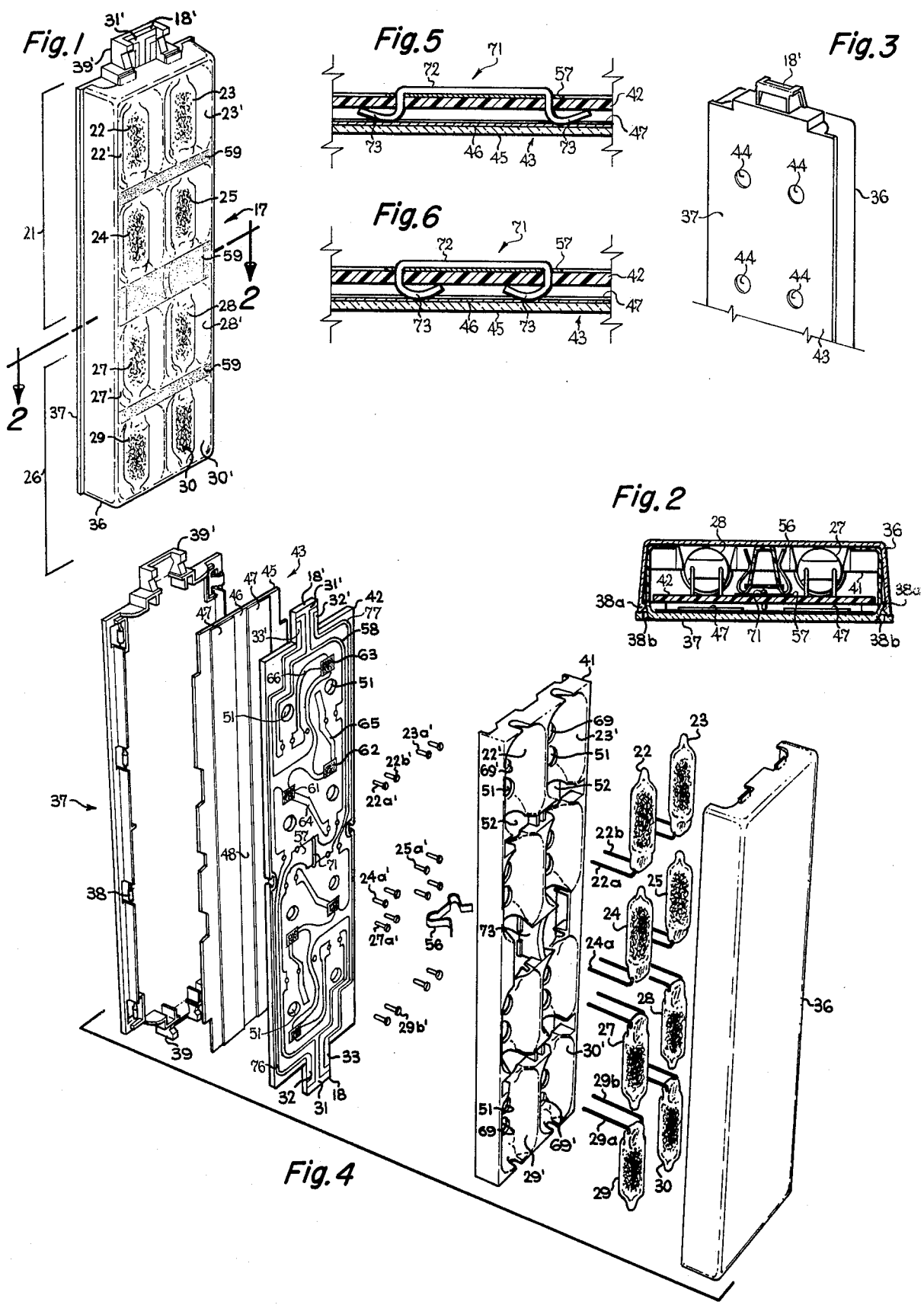

PHOTOFLASH LAMP ARRAY HAVING SHIELDED SWITCHING CIRCUIT

BACKGROUND OF THE INVENTION

The invention is in the field of multiple photoflash lamp units, such as planar arrays.

The FlipFlash type of photoflash array is a multiple flash lamp unit that can be connected to a camera in different orientations in each of which a different group of the flash lamps is relatively farther from the camera lens axis than are the other lamps of the unit. The lamps and electrical circuitry are arranged so that in any of the orientations of the unit with respect to the camera, only the group of lamps relatively farther from the lens axis can be flashed. The purpose of such an arrangement is to position the "active" group of flash lamps farther above the camera lens in order to reduce the possibility of a "red-eye" effect that causes the pupils of a person's eyes to appear red or pink in flash pictures taken when the flash lamp is close to the camera lens.

Such flash units employ high voltage types of flash lamps which are flashed by a high voltage pulse (1000 or 2000 volts, for example) of low energy, and are prone to electrostatic firing of one or more lamps if a connection terminal is touched by or brought into close proximity to a person or object having an electrostatic charge. Such undesirable accidental flashing of lamps can also occur if the flash unit housing, which usually is made of a plastic material, acquires an electrostatic charge and a connector terminal is touched by or brought into close proximity to a person or object. The problem can also occur, and can be more severe, if both the plastic housing and the person or object near to or touching a connection terminal are electrostatically charged with relatively opposite polarities.

Various ways have been devised for reducing the likelihood of accidental flashing of lamps by electrostatic charges, for example by providing an electrically conductive shield adjacent to the circuit board and electrically connecting the shield to the common or "ground" electrical part of the circuitry of the circuit board. The shield increases the stray capacitance to surrounding space so that electrostatic charges applied to the flash array tend to dissipate into surrounding space rather than through the flash lamps. U.S. Pat. No. 3,935,442 to Hanson discloses a flash array having a shield in the form of a conductive reflector unit connected to electrical ground of the circuit board. U.S. Pat. No. 3,941,992 to Blount et al discloses a flash array having an electrically grounded shield adjacent to or on the rear surface of the circuit board, and U.S. Pat. No. 4,019,043 to Blount discloses a flash array having a metal foil sheet behind the circuit board and electrically grounded by means of eyelets through the circuit board.

SUMMARY OF THE INVENTION

Objects of the invention are to provide an improved flash lamp array, and to provide improved and economical means for preventing accidental electrostatic flashing of lamps in such an array.

The invention comprises, briefly and in a preferred embodiment, a multiple flash lamp array which comprises a lamp flashing circuit in the form of a printed circuit on a surface of a circuit board. An electrically conductive sheetlike shield is provided adjacent and parallel to the other surface of the circuit board to reduce the possibility of accidental flashing of lamps by electrostatic voltage, which flashing tends to occur particularly when high voltage, low energy types of lamps are used in the array. The shield is connected electrically by means of a wire staple having its flat central portion over and against an electrical common or "ground" circuit run on the front of the circuit board. The legs of the staple extend through the circuit board and are bent over in a curved manner behind the circuit board so as to contact against the shield and space it from the rear of the circuit board. A plurality of electrical terminals are provided on the array for connecting it to a socket of a camera or flash adapter, one of which terminals is shaped and arranged to be relatively more touchable than the others and is electrically connected to the common "ground" of the circuit and, via said staple, to the shield. The common "ground" of the circuit also is connected to a lead-in wire of each lamp, and to a conductive reflector member, in addition to the shield, these members and connections constituting part of the common electrical portion of the circuit and having a relatively large stray capacitance to ground. By thus making one terminal more readily touchable and providing it with a relatively large stray capacitance to ground, an electrostatic charge applied to this terminal will be principally diverted through the larger stray capacitance to ground instead of passing through flash lamps in the array. Also, the shield on the one side and the conductive reflector on the other side of the circuit board shield the circuitry from electrostatic charges. The shield preferably is spaced from the rear side of the circuit board to reduce the capacitance between the shield and the non-common electrical portions of the circuit on the front side of the circuit board.

Preferably, the shield is a sheet of electrically conductive paper, plastic, or metal foil, or a sheet of conductively coated paper, which may also function as an indicia sheet by carrying indicia such as instructions, information, etc., on its back side. Also, in the preferred embodiment, plastic flash indicator strips are associated with the shield and serve as electrical insulation to prevent the shield from shorting across the lamps.

BRIEF DESCRIPTION OF THE DRAWING

FIG. 1 is a perspective view of a multiple flash lamp array in accordance with a preferred embodiment of the invention.

FIG. 2 is a cross-sectional view of FIG. 1, taken on the line 2—2 thereof.

FIG. 3 is a perspective rear view of a portion of the array of FIG. 1.

FIG. 4 is an exploded perspective view of the array of FIG. 1.

FIGS. 5 and 6 are cross-sectional views of a portion of the circuit board and shield, showing alternative configurations of the staple which connects the shield to electrical ground.

DESCRIPTION OF THE PREFERRED EMBODIMENT

A multiple flash lamp unit 17 of the planar array type and containing a plurality of electrically fired flash lamps is provided with a plug-in connector tab 18 at the lower end thereof, adpated to fit into a socket of a camera or flash adapter as shown and described in the above-referenced Blount patent. The lamp array 17 is provided with a second plug-in connector tab 18' at the top end thereof, whereby the array 17 is adapted to be attached to the camera socket in either of two orientations, i.e., with either the tab 18 or the tab 18' plugged into the socket. The array 17 is provided with an upper group 21 of flash lamps 22, 23, 24, and 25, and a lower group 26 of flash lamps 27, 28, 29, and 30, the lamps being arranged in a planar configuration. Reflectors 22', etc., are disposed behind the respective flash lamps, so that as each lamp is flashed its light is projected forwardly of the array 17. The lamps are arranged and connected so that when the array is connected to a camera by the connector 18, only the upper group 21 of lamps will be flashed, and when the array is turned end for end and connected to the camera by the other connector 18', only the then upper group 26 of lamps will be flashed. By this arrangement, only lamps relatively far from the lens axis are flashable, thus reducing the undesirable red-eye effect, as is more fully described in the above-referenced patents.

The construction of the array comprises front and back housing members 36 and 37, which preferably are made of plastic and are provided with interlocking members 38 which can be molded integrally with the housing members and which lock the housing members together in final assembly to form a unitary flash array structure. FIG. 2 shows a pair of interlocking members 38a carried at the rear of the side of the front housing member 36 interlocked with a pair of interlocking members 38b of the back housing member 37. In the preferred embodiment shown, the front housing member 36 is a rectangular concavity and the back housing member 37 is substantially flat and includes integral extensions 39 and 39' at the ends thereof which partly surround and protect the connector tabs 18 and 18' and also function to facilitate mechanical attachment to the camera socket. Sandwiched between the front and back housing members 36 and 37, in the order named, are the flash lamps 22, etc., a unitary reflector member 41 (preferably of aluminum-coated plastic) shaped to provide the individual reflectors 22', etc., a printed circuit board 42 provided with integral connector tabs 18 and 18', and an electrically conductive indicia sheet 43 which may be provided with instructions, information and other indicia such as flash indicators 44 located behind the respective lamps and which change color due to heat and/or light radiation from the flashing lamp, thus indicating at a glance which of the lamps have been flashed and not flashed.

The indicia sheet 43 may be of paper or thin cardboard 45 coated with a layer of metal 46 such as aluminum, and is provided with openings where the flash indicators 44 are desired. The openings are covered with flash indicator material, such as a sheet-like heat-sensitive plastic material, for example biaxially oriented polypropylene, which shrinks or melts when subjected to heat or radiant energy from an adjacent flashing lamp thus effectively changing the color of the openings in the indicia sheet 43. For example, the plastic material can be colored green on its back side by ink or other suitable means, and the green disappears and the opening becomes a different color (dark, for example) when the plastic shrinks or melts away due to heat from an adjacent flashing lamp. The front of the plastic (toward the lamps) should be coated with dark ink so as to absorb heat more readily. Two strips 47 of flash indicator material may be arranged to cover all of the flash indicator openings, leaving the center part 48 of the metal coating bare for making an electrical connection which will be described. Openings 51 are provided through the reflector unit 41 and the circuit board 42 to facilitate radiation from flashing lamps reaching the flash indicators 47. The rear housing member 37 is transparent (either of clear material or provided with window openings) to permit viewing of the indicia on the indicia sheet 43. The front housing member 36 is transparent at least in front of the lamps 22, etc., to permit light from flashing lamps to emerge frontwardly of the array, and may be tinted to alter the color of light from the flash lamps.

The height and width of the rectangular array are substantially greater than its thickness, and the heights and widths of the reflector member 41, circuit board 42, and indicia sheet shield 43 are substantially the same as the interior height and width of the housing member 36, to facilitate holding the parts in place.

The tab 18, which is integral with the circuit board 42, is provided with a pair of electrical terminals 31 and 32, and similarly the tab 18' is provided with a pair of terminals 31' and 32', for contacting terminals of a camera socket for applying firing voltage pulses to the array. Each tab is provided with a third terminal 33 and 33', respectively, which functions to electrically short the circuitry of the inactive lower group of lamps, when the array is plugged into a socket, as is described in the above-referenced Blount patent. The terminals 31 and 31' are shown as having a lateral "T-bar" configuration for temporarily shorting the socket terminals while the array is being plugged in, to discharge any residual voltage charge in the firing pulse source and also to reduce the likelihood of lamps being accidentally flashed by electrostatic voltage when the array is handled, as is disclosed and claimed in U.S. Pat. No. 3,980,876 to Cote.

The circuit board 42 has a "printed circuit" thereon, as will be described, for causing sequential flashing of the lamps by firing voltage pulses applied to the terminals 31, 32 or 31', 32'. The top and bottom halves of the printed circuitry preferably are reverse mirror images of each other. The lead wires 22a, 22b, etc., of the lamps 22, etc., may be attached to the circuit board 42 in various ways, such as by means of metal eyelets 22a', 22b', etc., placed through openings in the board. The lead wires 22a, 22b, etc., pass through openings 52 in the reflector member 41 and into or through the respective pairs of eyelets 22a', 22b', etc., and the ends of the eyelets are crimped or bent to hold the lead wires and make electrical contact thereto and also to hold the eyelets in place with their heads in electrical contact with the circuit of the circuit board.

A clip 56 is clipped onto the reflector member 41, which reflector preferably is made of metal-coated plastic, and the rear of the clip 56 rests in touching contact against an area 57 of an electrical ground circuit run 58 on the board and which includes the terminals 31 and 31' and which makes contact with one of the connector eyelets 22a' or 22b', etc., for each of the lamps 22, etc., whereby the reflector unit 41 additionally functions as an electrically grounded shield, as is disclosed and claimed in the above-referenced Hanson patent.

Areas 59 on the transparent front housing member 36 may be made opaque or partly opaque, such as by making the surface roughened at these areas, to fully or partly conceal the lamp lead-in wires 22a, 22b, etc., and/or the lower portions of the lamps, for improved appearance of the array.

The circuit board terminal 32 is part of a conductor run that is electrically connected to lead-in wire 24a of lamp 24 at the eyelet 24a' and terminates at radiation switches 61, 62, and 63 respectively positioned near lamps 24, 25, and 23. A circuit board conductor run 64 is connected electrically to the remaining lead wire of flash lamp 25 at eyelet 25a' and terminates at the radiation switch 61. A circuit board conductor run 65 is connected to the remaining lead-in wire of flash lamp 23 at eyelet 23a' and terminates at the radiation switch 62. Similarly, a circuit board conductor run 66 is connected to the remaining lead-in wire of flash lamp 22 at eyelet 22b' and terminates at radiation switch 63.

The radiation switches 61, 62, and 63 are respectively in contact with and bridge across the circuit runs that are connected to them. The material for the radiation switches may be suitable material initially having an open circuit or high resistance, the resistance thereof becoming zero or a low value when the material receives radiation in the form of heat and/or light from a respective adjacent lamp, upon the lamp being flashed. For this purpose, each of the radiation switches is respectively positioned behind and near to a flash lamp 24, 25, 23. Windows in the form of transparent sections or openings 69 may be provided in the reflectors in front of the switches as shown in FIG. 2 to facilitate radiation transfer. A suitable material for the radiation switches is silver oxide dispersed in a binder such as polyvinyl resin. Each of these radiation switches, upon receiving heat and/or light radiation from the adjacent lamp when it is flashed, changes from an open circuit or high resistance to a closed circuit or low resistance between its switch terminals on the circuit board.

As has been explained, the lower portion of the circuit board contains a substantially reverse mirror image of the same circuit shown in the upper part of the circuit board, and therefore will not be described in detail. It will be noted that the circuit runs from the plugged-in terminals 31 and 32 at the lower part of the circuit board extend upwardly so as to activate the circuitry in the upper half of the circuit board. Similarly, when the unit is turned around and tab 18' is plugged into a socket, the circuit board terminals 31' and 32' will be connected to and activate the lamps which then will be in the upper half of the circuit board, and hence in the upper half of the flash unit 17. This accomplishes, as has been stated, the desirable characteristic whereby only the group of lamps relatively farthest away from the lens axis will be flashed, thereby reducing or eliminating the undesirable red-eye effect.

The circuit on the circuit board 42 functions as follows. Assuming that none of the four lamps in the upper half of the unit 17 have been flashed, upon occurrence of a first firing pulse applied across the terminals 31, 32, this pulse will be directly applied to the lead-in wires of the first-connected flash lamp 24, whereupon the lamp 24 flashes and becomes an open circuit between its lead-in wires. Heat and/or light radiation from the flashing first lamp 24 causes the adjacent radiation switch 61 to become a closed circuit (or a low value of resistance), thereby connecting the circuit board terminal 32 electrically to the lead-in wire of the second lamp 25 at eyelet 25a'. By the time this occurs, the firing pulse has diminished to a value insufficient to cause the second lamp 25 to flash. When the next firing pulse occurs, it is applied to the lead-in wires of the second lamp 25, via the now closed radiation switch 61, whereupon the second lamp 25 flashes, thereby causing radiation switch 62 to assume zero or low resistance, and the second lamp 25 now has an open circuit or high resistance between its lead-in wires. When the next firing pulse occurs, it is applied via now closed radiation switch 62 to the third lamp 23, thereby firing the lamp which becomes an open circuit, and the radiation from it causes the radiation switch 63 to become essentially a closed circuit across its terminals. Thus, the next firing pulse will be applied, via now closed radiation switch 63, to the lead-in wires of the fourth flash lamp 22, thereupon causing the lamp to flash. Since this lamp is the last lamp in the active circuit, it does not matter whether its lead-in wires are an open or closed circuit after flashing. Additional flash lamps, radiation switches, and electrical conductors can be employed, if desired, using the just described principles. When the flash unit is turned around the other connector tab 18' attached to the camera socket, the group of lamps that then become uppermost and relatively farthest away from the lens axis will be in an active circuit and will be flashed in the same manner as has been described. In a preferred embodiment, the lamps 22, etc., are high voltage types, requiring about 2000 volts for example, at low current, for flashing, and they can be fired by impacting or stressing a piezoelectric element in the camera.

In accordance with the present invention, a staple 71 of wire or other elongated electrically conductive material is positioned on the circuit board with the flat central region 72 thereof in contact against an electrical ground such as the electrical ground area 57 at the center of the circuit board. The legs 73 of the staple 71 pass through the circuit board and are bent sideways behind the board to hold the central region 72 securely against the electrical ground area 57. The staple legs 73 may be bent mutually outwardly and away from each other as shown in FIG. 5, or mutually inwardly and toward each other as shown in FIG. 6. The outwardly bent legs per FIG. 5 have been found to hold the staple's central region 72 more securely against the electrical ground area 57 than the inwardly bent legs embodiment of FIG. 6.

The staple 71 can be applied to the circuit board 42 by inserting its legs 73, which are intially straight and parallel, through openings provided in the circuit board, or, alternatively, the staple 71 can be force-driven through the board if made of suitable material. The legs 73 can be bent and shaped by an anvil placed behind the board while the staple is driven through. The staple legs 73 are curved or inclined toward and against the back of the circuit board 42, as shown in FIGS. 5 and 6, so that they will make good electrical contact against the metal foil shield 46 at its center region 48 and will also function to space the shield 46 from the circuit board. As shown in FIG. 4, in the preferred embodiment, the staple 71 is positioned vertically, and parallel to the strips 47 of flash indicator material, so that both legs 73 of the staple can make contact against the metal foil shield 46 at its center region 48 between the flash indicator strips 47. The plastic flash indicator strips serve as electrical insulation to prevent shorting across the lamp lead-wire connection eyelets 22a', 22b', etc., by the metal foil shield 46.

The electrically grounded shield 46 achieves beneficial results of reducing the possibility of accidental lamp flashing in at least two ways. First, it shields the relatively "hot" circuit runs 76 and 77, which are close to the back of the array and separated therefrom only by the thickness of the circuit board 42 plus perhaps a small air space, and reduces the likelihood of these "hot" circuit runs from picking up a capacitively induced electrostatic voltage charge from the back 37 of the array housing, which voltage charge can be caused when the array is handled or contacts a charged object, especially if the housing is made of plastic. Secondly, the shield 46 helps to reduce the possibility of accidental electrostatic flashing of the lamps when the more readily touchable terminal 31 or 31' is touched when handling the array, because it is connected to the common circuit run 58 and increases the capacitance to ground of the common electrical circuit in the same manner as the reflector shield member 41 which also is connected to the common circuit run. With the shield 46, the conductive reflector 41 and the common circuit run 58 all being electrically common to the terminals 31 and 31', the improvement is enhanced since the possibility of spurious electrostatic flashing is reduced.

Another feature achieved by the curved staple legs 73 is the spacing of the shield 46 from the back of the circuit board 42, such as is shown in FIGS. 2, 5, and 6. For economy and feasibility of manufacturing, the circuit board preferably is thin, for example, about 1/20 inch in thickness. If the shield 46 is positioned against or near to the back of a thin circuit board, the capacitance between the shield and the "hot" circuit runs 76, etc., on the front of the board may be great enough to electrically load the camera's pulse generator, so that the firing pulse voltage might be insufficient to reliably flash a lamp.

It has been found that the shield-grounding staple arrangement of the present invention achieves improved reliability of the electrical connection between the shield 46 and the electrical ground run 57 of the circuit board, and at lower cost, than the use of eyelets for the same purpose as disclosed in the above-referenced Blount patent.

While preferred embodiments of the invention have been shown and described, various other embodiments and modifications thereof will become apparent to persons skilled in the art, and will fall within the scope of the invention as defined in the following claims.

What we claim as new and desire to secure by Letters Patent of the United States is:

1. A multiple flash lamp array comprising a plurality of flash lamps of the electrically fired type, a circuit board having circuitry on one side thereof for sequentially firing said lamps, means electrically connecting said lamps to said circuitry, and an electrically conductive shield in the form of a conductive sheet member positioned substantially parallel to and spaced from at least a part of the opposite side of said circuit board, said circuitry including at least one electrical ground circuit run on said one side of the board, and means electrically connecting said shield to said circuit run comprising a staple of conductive material having a pair of legs extending through said circuit board and having a center region positioned over and against a portion of said circuit run, said legs being bent at said opposite side of the circuit board so as to hold said center section of the staple against said circuit run, at least one of said legs of the staple being in contact against said shield.

2. An array as claimed in claim 1, in which said legs of the staple are bent outwardly away from each other at said other side of the circuit board.

3. An array as claimed in claim 1, in which said legs of the staple are bent inwardly toward each other at said other side of the circuit board.

4. An array as claimed in claim 1, in which the end regions of said legs of the staple are inclined toward said other side of the circuit board so that said legs of the staple space said shield from said other side of the circuit board.

5. An array as claimed in claim 1, in which said shield is provided with a pair of strips of flash indicator material on the side thereof facing said circuit board, said strips being mutually parallel and spaced apart to expose said shield therebetween, said at least one leg of the staple being in contact against said shield between said strips of flash indicator material.

6. An array as claimed in claim 5, in which said staple is aligned parallel to and between said strips of flash indicator material.

7. An array as claimed in claim 1, in which said array comprises a plurality of connector terminals arranged so that one of them is more readily touched than the others when said array is handled, and means electrically connecting said circuit run to said terminal that is more readily touched.

* * * * *